United States Patent
Yuzawa et al.

(10) Patent No.: US 6,551,918 B2
(45) Date of Patent: Apr. 22, 2003

(54) SEMICONDUCTOR DEVICE AND METHOD OF FABRICATION THEREOF, CIRCUIT BOARD, AND ELECTRONIC EQUIPMENT

(75) Inventors: Hideki Yuzawa, Iida (JP); Kazunori Sakurai, Chino (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 09/987,169

(22) Filed: Nov. 13, 2001

(65) Prior Publication Data
US 2002/0072214 A1 Jun. 13, 2002

Related U.S. Application Data

(63) Continuation of application No. 09/425,966, filed on Oct. 25, 1999, now Pat. No. 6,335,568.

(30) Foreign Application Priority Data

Oct. 28, 1998 (JP) ............................................. 10-322867

(51) Int. Cl.$^7$ ............................................... H01L 21/44
(52) U.S. Cl. ....................... 438/613; 438/106; 438/612; 257/737; 257/738; 257/780
(58) Field of Search .................... 438/617, 612, 438/613, 106, 108, 111, 123; 257/737, 738, 775, 780, 784, 673

(56) References Cited

U.S. PATENT DOCUMENTS

| 3,843,428 A | * | 10/1974 | Kraft ........................... 438/612 |
| 5,014,111 A | * | 5/1991 | Tsuda et al. ................. 257/737 |
| 5,027,995 A | | 7/1991 | Karl et al. |
| 5,263,246 A | * | 11/1993 | Aoki ........................... 29/843 |
| 5,485,949 A | * | 1/1996 | Tomura et al. ........... 228/180.5 |
| 5,508,561 A | | 4/1996 | Tago et al. |
| 5,536,973 A | | 7/1996 | Yamaji |
| 5,874,780 A | | 2/1999 | Murakami |
| 5,898,226 A | * | 4/1999 | Jeong et al. ................. 257/786 |
| 5,899,140 A | | 5/1999 | Yamamoto et al. |
| 5,953,624 A | * | 9/1999 | Bando et al. ............... 438/617 |
| 6,098,868 A | | 8/2000 | Mae et al. |
| 6,177,730 B1 | | 1/2001 | Kira et al. |

FOREIGN PATENT DOCUMENTS

JP  A 57-163919  10/1982

OTHER PUBLICATIONS

Ishibashi et al., "A New Anisotropic Conductive Film with Arrayed Conductive Particles," IEEE Trans. on Components, Packaging, and Manu. Tech. Part B: Advanced Packaging, pp. 752–757, Nov. 1996.

Oguibe et al., "Flip–Chip Assembly using Anisotropic Conducting Adhesives: Experimental and Modeling Results," Proceedings of 3$^{rd}$ International Conf. on Adhesive Joining and Coating Tech., pp. 27–33, Sep. 28–30, 1998.

* cited by examiner

Primary Examiner—Matthew Smith
Assistant Examiner—Lex H. Malsawma
(74) Attorney, Agent, or Firm—Oliff & Berridge, PLC (57) ABSTRACT

A method of fabricating a semiconductor device including: a first step of bonding a conductive wire to any one of a plurality of electrodes of a semiconductor chip; a second step of tearing off the bonded conductive wire in such a manner that a part remains on one of the electrodes; a third step of pressing the part of the conductive wire remaining on the one of the electrodes, to form a bump having a head portion and a base portion; and, a fourth step of bonding a lead to the bump; wherein a distance D between an upper surface of the base portion of the bump and an upper surface of the head portion is such that: $0 < D \leq 6$ $\mu$m.

22 Claims, 9 Drawing Sheets

$0 < D \leqq 6 \mu m$ $C > E = \dfrac{A-B}{2}$

SEMICONDUCTOR DEVICE AND METHOD OF FABRICATION THEREOF, CIRCUIT BOARD, AND ELECTRONIC EQUIPMENT

This is a Continuation of application Ser. No. 09/425,966 filed Oct. 25, 1999 now U.S. Pat. No. 6,335,568. The entire disclosure of the prior application is hereby incorporated by reference herein in its entirety.

BACKGROUND OF THE INVENTION

1. Field of the Invention

This invention relates to a semiconductor device and a method of fabrication thereof, as well as a circuit board and electronic equipment.

2. Description of Related Art

Methods are known of forming a bump on an electrode of a semiconductor chip, using wire bonding techniques. Japanese Patent Application Laid-Open No. 57-163919, for example, discloses a method of creating a bump by using a capillary tube to bond a wire to an electrode, then forming a bump by tearing off the wire so that a fragment of the wire remains on the electrode. This method makes it possible to form a bump rapidly, in comparison with the method in which plating is accumulated.

However, it is not possible to guarantee that a bump formed by tearing off a wire has a sufficiently flat upper surface. This causes no problems when semiconductor chip are bonded face-down to a substrate, but it does cause problems in that connection accuracy deteriorates when a lead is bonded to the bump. In other words, an upper surface of the bump is jagged or has very little surface area that is flat, and thus insufficient surface area thereof is in contact with the lead and thus the lead may separate from the bump.

SUMMARY OF THE INVENTION

This invention was devised to solve the above problem and has as an objective thereof the provision of a semiconductor device having a bump which can be formed easily and which can also be connected in a suitable manner to a lead, a method of fabricating such a semiconductor device, a circuit board, and electronic equipment.

(1) According to a first aspect of the present invention, there is provided a method of fabricating a semiconductor device, comprising:

- a first step of bonding a conductive wire to any one of a plurality of electrodes of a semiconductor chip;
- a second step of tearing off the bonded conductive wire in such a manner that a part of the conductive wire remains on the one of the electrodes;
- a third step of pressing the part of the conductive wire that remains on the one of the electrodes, to form a bump comprising a base portion in contact with the one of the electrodes and a head portion of a width that is less than the width of the base portion; and
- a fourth step of bonding the bump and a lead;
- wherein a distance D between an upper surface of the base portion of the bump and an upper surface of the head portion of the bump is set in the third step in such a manner that: $0<D\leq 6\,\mu m$.

With this aspect of the invention, a bump can be formed simply by bonding a conductive wire to an electrode, tearing off it to leave a part thereof on the electrode, and then pressing and deforming that part. These steps take less time in comparison with the steps required for forming the bump by plating. In addition, the distance D between the upper surface of the base portion of the bump and the upper surface of the head portion thereof is set to be such that: $0<D\leq 6\,\mu m$. In this case, the condition that D is not equal to zero means that it is not necessary to press the remaining part of the conductive wire on the electrode so strongly that the head portion disappears. This means that the shock imparted to the semiconductor chip when the remaining part of the conductive wire is pressed can be reduced. The condition that D is less than or equal to 6 $\mu m$ means that the quality of the bonding of a lead can be kept constant, regardless of the width of the head portion of the bump. This enables connection of the lead with a good positional accuracy.

(2) In this method of fabricating a semiconductor device, a width A of the base portion of the bump, a width B of the head portion of the bump, and a width C of the lead may be in a relationship such that: $C>(A-B)/2$.

(3) In this method of fabricating a semiconductor device, the first and second steps may be repeated before the third step, to provide parts of conductive wires on the plurality of electrodes; and the parts of the conductive wires remaining on the plurality of electrodes may be simultaneously pressed in the third step, to form a plurality of bumps simultaneously.

Since a plurality of bumps are simultaneously formed, the process can be shortened.

(4) In this method of fabricating a semiconductor device, the lead may protrude into an opening formed in a substrate; and the bump may be disposed within the opening such that the lead is bonded to the bump within the opening in the fourth step.

(5) In this method of fabricating a semiconductor device, the lead may be formed on a substrate; and the bump may be arranged to face the lead on the substrate for the face-down bonding of the semiconductor chip in the fourth step.

(6) In this method of fabricating a semiconductor device, the bump may be bonded to the lead in the fourth step by an anisotropic conductive material formed of conductive particles dispersed within an adhesive.

(7) According to a second aspect of the present invention, there is provided a semiconductor device comprising:

- a semiconductor chip having a plurality of electrodes;
- a bump which is formed on each of the electrodes and has a base portion in contact with one of the electrodes and a head portion of a width smaller than the width of the base portion;
- a lead bonded to the bump; and
- a substrate on which the lead is formed;
- wherein a distance D between an upper surface of the base portion of the bump and an upper surface of the head portion of the bump is such that: $0<D\leq 6\,\mu m$.

With this aspect of the invention, the lead is bonded to a head portion that has a width less than that of a base portion of the bump. In this case, the condition that D is less than or equal to 6 $\mu m$ means that the quality of the bonding of a lead can be kept constant, regardless of the width of the head portion of the bump. This enables connection of the lead with a good positional accuracy.

(8) In this semiconductor device, a width A of the base portion of the bump, a width B of the head portion of the bump, and a width C of the lead may be in a relationship such that: $C>(A-B)/2$.

(9) In this semiconductor device, the substrate may have an opening, the lead may protrude into the opening in the substrate, and the bump may be bonded to the lead within the opening.

(10) In this semiconductor device, the lead may be formed on a substrate, and the bump may be arranged to face the lead on the substrate for the face-down bonding of the semiconductor chip.

(11) In this semiconductor device, the bump may be bonded to the lead by an anisotropic conductive material formed of conductive particles dispersed within an adhesive.

(12) According to a third aspect of the present invention, there is provided a circuit board on which is mounted the above described semiconductor device.

(13) According to a fourth aspect of the present invention, there is provided electronic equipment having the above described semiconductor device.

DESCRIPTION OF PREFERRED EMBODIMENTS

Preferred embodiments of this invention are described below with reference to the accompanying drawings. The method of fabricating a semiconductor device in accordance with this invention can be applied irrespective of the method used to connect a lead to a bump. Examples of the connection method used are tape automated bonding (TAB), flip-chip bonding, face-down bonding including methods such as chip-on-film (COF) or chip-on-glass (COG) bonding, and bonding using an anisotropic conductive material.

The package of a semiconductor device in accordance with this invention could be any package that employs a ball grid array (BGA) including a tape ball grid array (T-BGA), a chip size/scale package (CSP) including a tape chip size/scale package (T-CSP), or a tape carrier package (TCP) that has been packaged after using TAB connection techniques. Of these, the most suitable method for the application of this invention is one in which leads protrude as free ends from a tape, such as T-BGA or TCP, and the connection method uses a tool.

First Embodiment

FIGS. 1A to 6 are views for illustrating a first embodiment to which this invention is applied. In this method of fabricating a semiconductor device in accordance with this embodiment, the TAB technique is used. In addition, the semiconductor device to which a T-BGA package is applied is fabricated.

Figure 1A:
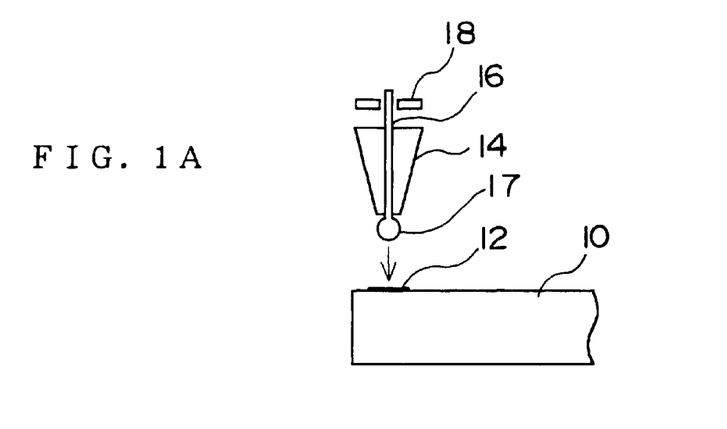
FIGS. 1A to 1C illustrate a step of bonding a conductive wire in accordance with a first embodiment of this invention.

A step of forming a bump on an electrode of the semiconductor chip is shown in FIGS. 1A to 2B. First of all, a semiconductor chip 10 is provided, on which is formed one or a plurality of electrodes 12, as shown in FIG. 1A. Each electrode 12 is normally formed of a material such as aluminum, in a flat and thin shape on a surface of the semiconductor chip 10 on which active elements are formed. The shape of the side surfaces or cross-sectional surfaces thereof are not specifically limited if the electrode does not have a shape of a bump. The top surface of the electrode may be at the same height as the top surface of the semiconductor chip 10. The shape of a flat surface of the electrode 12 is also not specifically limited, so that it can be either circular or rectangular.

A capillary tube 14 is disposed on the side of the semiconductor chip 10 on which the electrode 12 is formed. A conductive wire 16 is passed through the capillary tube 14. The conductive wire 16 would often be formed of a material such as gold, copper, or aluminum, but the material is not specifically restricted provided it is electrically conductive. A ball 17 is formed in the conductive wire 16 on the outer side of the capillary tube 14. The ball 17 is formed in the tip of the conductive wire 16 by a method such as the discharge of a high voltage by an electric torch, by way of example.

Figure 1B:
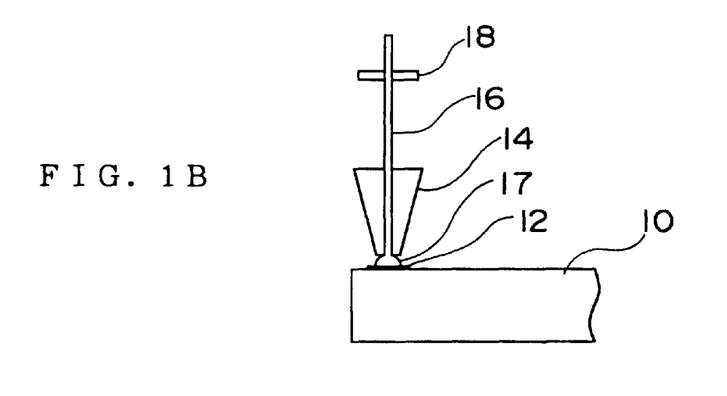

The capillary tube 14 is disposed over one electrode 12 so that the ball 17 is disposed over that one electrode 12. A damper 18 opens, the capillary tube 14 is lowered, and the ball 17 is pressed against the electrode 12. An agency such as ultrasonic waves, heat, or the like is applied while the ball 17 is being pressed against the electrode 12 by the application of a constant pressure. Thus the conductive wire 16 is bonded to the electrode 12 as shown in FIG. 1B.

Figure 1C:
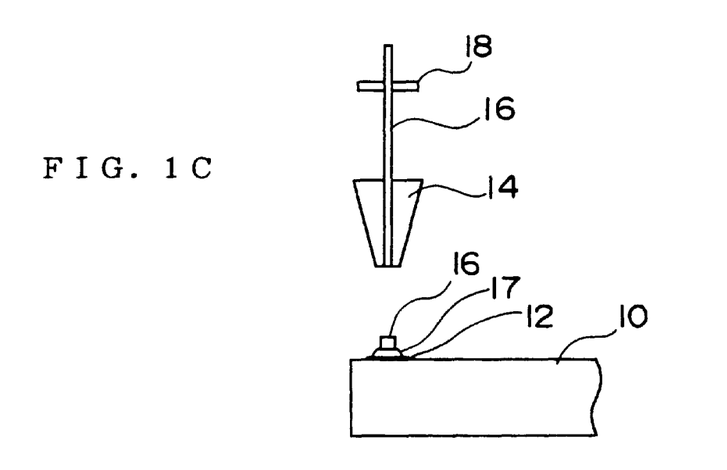

The damper 18 then closes to hold the conductive wire 16, and the capillary tube 14 and the damper 18 are simultaneously raised, as shown in FIG. 1C. The conductive wire 16 is thus torn off so that a portion thereof comprising the ball 17 remains on the electrode 12. If it is necessary to form bumps for a plurality of electrodes 12, the above steps can be repeated for each of this plurality of electrodes 12.

The part of the conductive wire 16 that remains on the electrode 12 can be regarded as a projection on the ball 17, but an upper surface of this remaining part is often small and not flat.

Figure 2A:
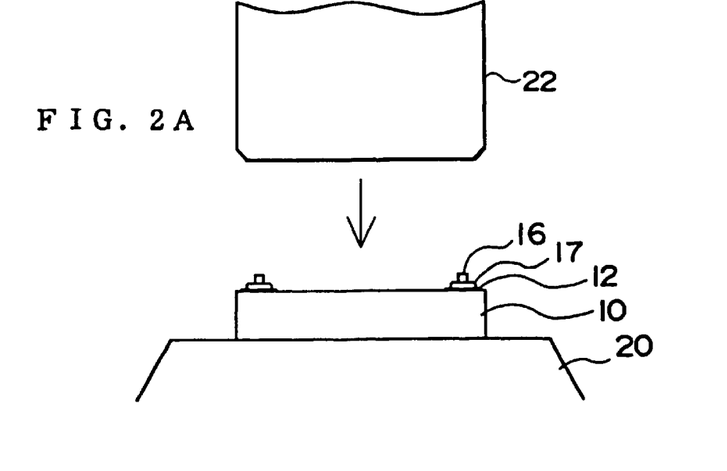
FIGS. 2A to 2C illustrate a method of forming a bump in accordance with the first embodiment of this invention.
Figure 2B:
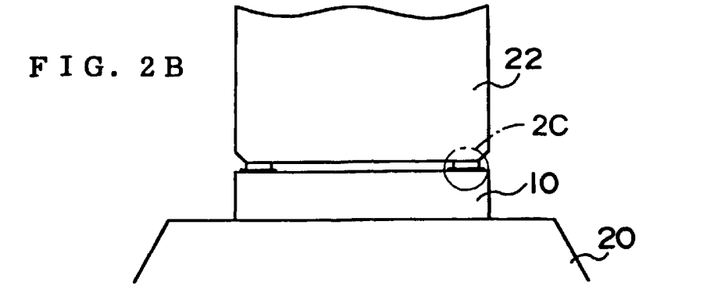
Figure 2C:
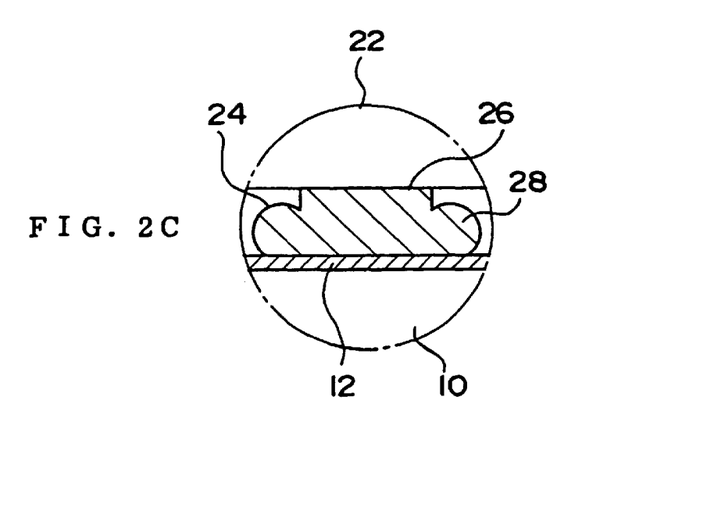

At this point, the step shown in FIGS. 2A and 2B is performed. In other words, the semiconductor chip 10, which has the part of the conductive wire 16 (comprising the ball 17) that has been bonded onto the electrode 12, is placed on a stand 20, and the part of the conductive wire 16 (comprising the ball 17) is pressed and deformed by a pressing tool 22, as shown in FIG. 2B. It should be noted that, in this embodiment of the invention, the remaining parts of the conductive wires 16 on a plurality of the electrodes 12 can be pressed simultaneously, or one remaining part of the conductive wire 16 (comprising the ball 17) on each electrode 12 can be pressed in turn.

In this manner, a bump 24 is formed on top of the electrode 12, as shown enlarged in FIG. 2B. The bump 24 is formed of a head portion 26 and a base portion 28. The base portion 28 is a portion formed by pressing and deforming the ball 17, and is in contact with the electrode 12 over a surface area that is wider than that of the head portion 26. The head portion 26 is a portion formed by pressing and deforming the remaining part of the conductive wire 16 that has been torn off, and in plan view it appears to be smaller than the base portion 28. The head portion 26 has an upper surface that has been flattened by the pressing tool 22.

Figure 3:
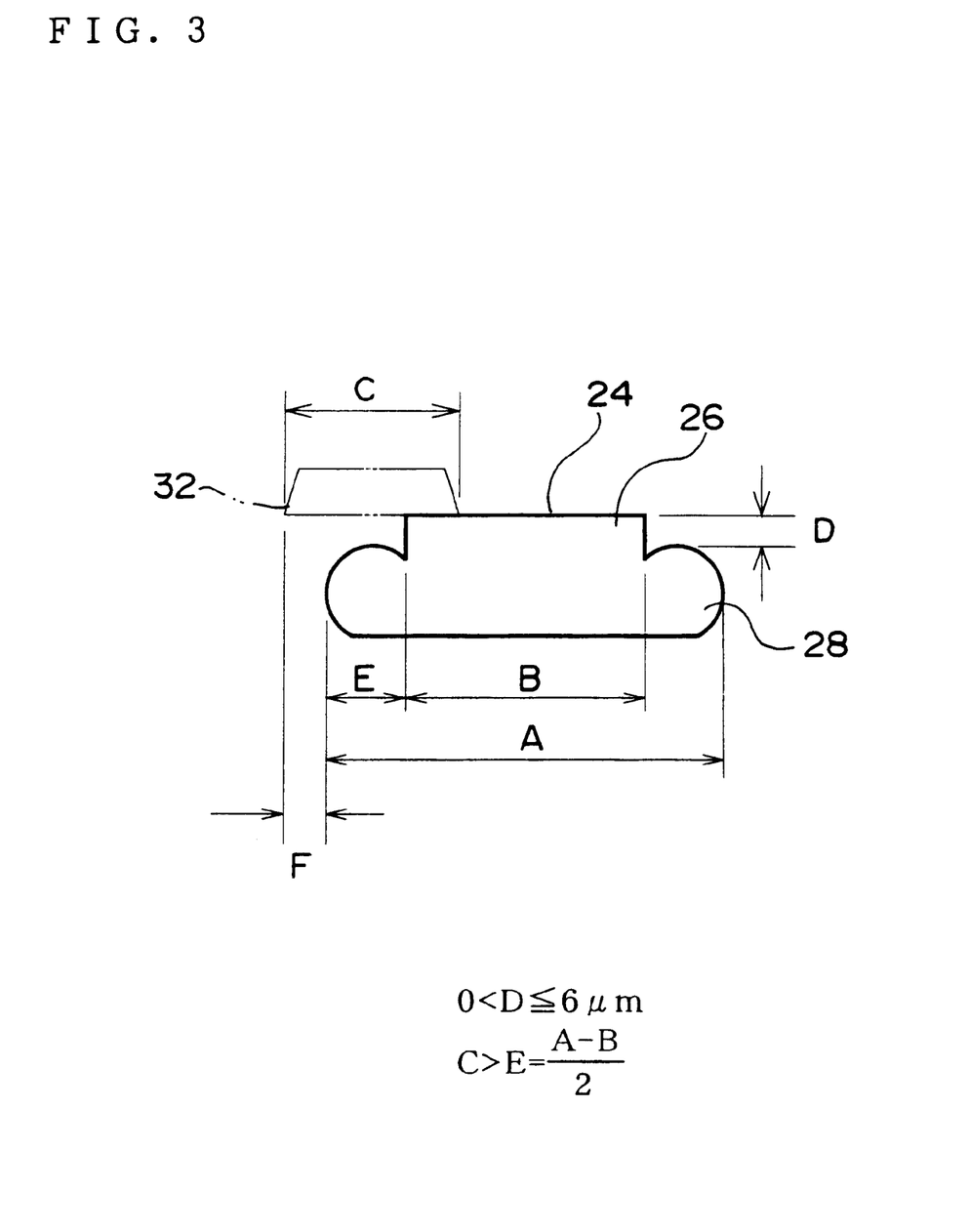
FIG. 3 is an enlarged view of the bump in accordance with the first embodiment of this invention.

An enlarged view of the bump 24 is shown in FIG. 3. A distance D between the upper surface of the base portion 28 of the bump 24 and the upper surface of the head portion 26 of the bump 24 is such that: 0<D≦6 μm. In this case, the condition that D is not equal to zero means that it is not necessary to press the remaining part of the conductive wire 16 on the electrode 12 so strongly that the head portion 26 disappears. This means that the shock imparted to the semiconductor chip 10 when the remaining part of the conductive wire 16 is pressed can be reduced. The condition that D is less than or equal to 6 μm means that the quality of the bonding of a lead 32 (which will be described later) can be kept constant, regardless of the width (diameter) A of the base portion 28 and the width (diameter) B of the head portion 26. This will be made clear from experimental results that will be discussed later.

Figure 4A:
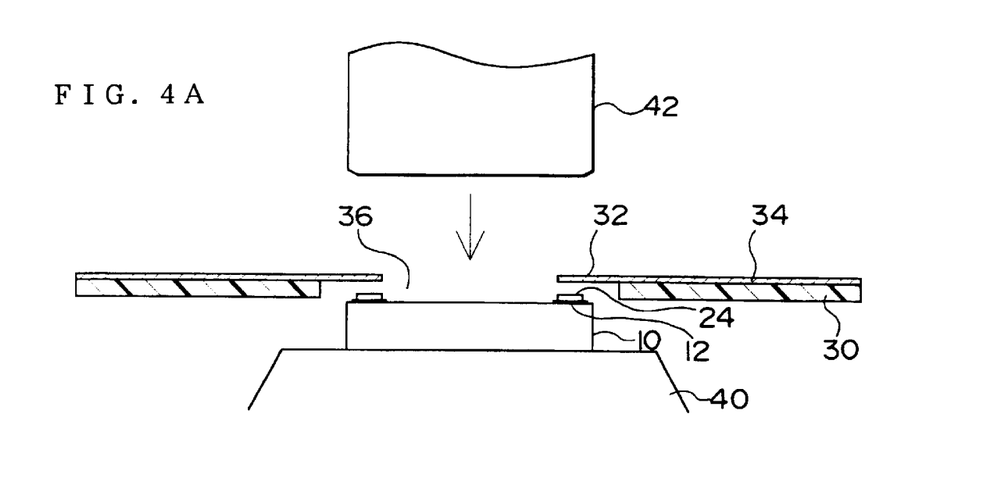
FIGS. 4A and 4B show a step of bonding a lead in accordance with the first embodiment of this invention.
Figure 4B:
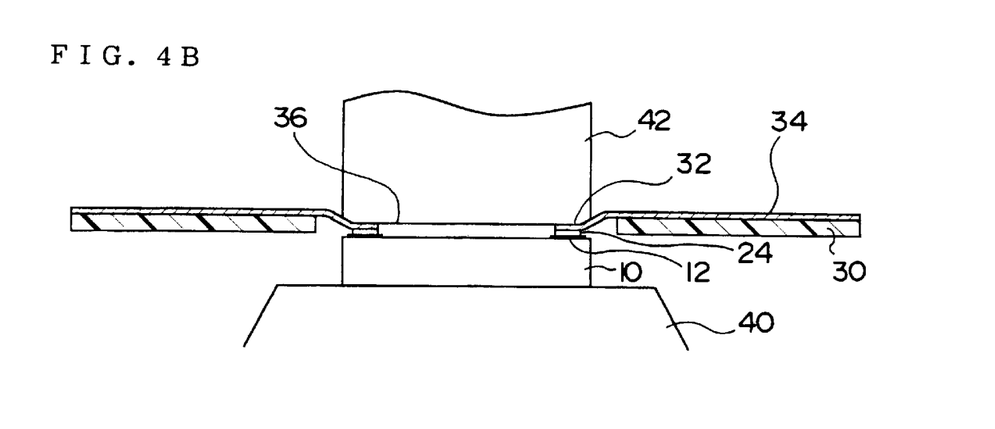

The lead 32 is then bonded to the bump 24, as shown in FIGS. 4A and 4B. In other words, the semiconductor chip 10 is placed upon a stand 40, as shown in FIG. 4A, the lead 32 which is formed on a substrate 30 is placed thereupon, and a pressing tool 42 is disposed thereabove. Note that the stand 20 and the pressing tool 22 that were used for pressing the remaining part of the conductive wire 16 on the electrode 12 could also be used as the stand 40 and the pressing tool 42.

The substrate 30 could be formed of either an organic or an inorganic material, or it could have a structure that is a composite thereof. A flexible substrate of a polyimide resin could be cited as an example of the substrate 30 formed of an organic material. A tape used in the TAB technique could be used as a flexible substrate. A ceramic or glass substrate could be cited as an example of the substrate 30 formed of an inorganic material. A glass epoxy substrate could be cited as an example of a composite structure formed of organic and inorganic materials.

An interconnecting pattern 34 is formed on the substrate 30. The interconnecting pattern 34 is formed on one surface of the substrate 30. An opening (device hole) 36 is formed in the substrate 30, and one or a plurality of leads 32 protrude into the opening 36. Each lead 32 is connected electrically to the interconnecting pattern 34. Note that the width C of each lead 32, in other words, the length parallel to the surface and perpendicular to the lengthwise direction of the lead 32, can be set as shown in FIG. 3 in such a manner that: C>E=(A−B)/2.

The thus-configured substrate 30 is disposed with the lead 32 and the interconnecting pattern 34 thereof on the opposite side thereof from the semiconductor chip 10, as shown in FIG. 4A. The substrate 30 is disposed in such a manner that the bump 24 of the semiconductor chip 10 is positioned within the opening 36. In addition, the lead 32 formed on the substrate 30 is positioned above the bump 24.

The lead 32 is then bonded to the bump 24 by the pressing tool 42, as shown in FIG. 4B. More specifically, the lead 32 is bent by the pressing tool 42 and is pressed against the bump 24, then ultrasonic oscillation, heat or the like is applied thereto to connect the two components. Note that this connection causes the materials of the lead 32 and the bump 24 to melt, due to the oscillation or heat. In this case, if gold is used for the bump 24 and tin is coated over the surface of the lead 32 which is made of copper, gold-tin eutectics are formed. In this embodiment of the invention, gang-bonding in which a plurality of the leads 32 are bonded simultaneously is carried out, but single-point bonding could be performed instead.

Note that if the substrate used has a structure such that the lead does not protrude into the opening, the lead is pressed onto the bump with the substrate therebetween.

In this embodiment of the invention, the lead 32 is positioned on the opposite side from the semiconductor chip 10 and the lead 32 is bent within the opening 36. If TCP or T-BGA is utilized, and the lead 32 protrudes into the opening 36, the lead 32 bends, regardless of which side the lead 32 is with respect to the semiconductor chip 10. Alternatively, if face-down bonding or flip-chip bonding is utilized, the lead 32 does not bend.

Figure 5:
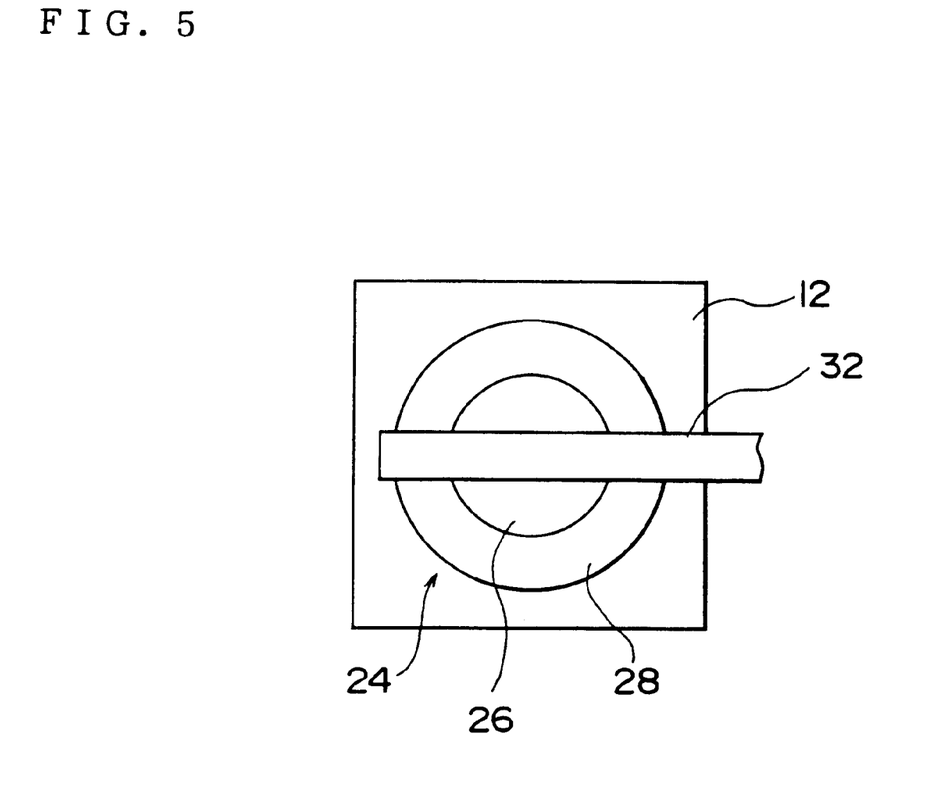
FIG. 5 shows the relationship between the lead and bump in accordance with the first embodiment of this invention.

The lead 32 could be bonded to the bump 24 in such a manner that the tip thereof protrudes beyond the bump 24, as shown in FIG. 5. Such a configuration makes it possible to guarantee a sufficiently wide contact surface area between the lead 32 and the bump 24, because the lead 32 will traverse the upper surface of the head portion 26 of the bump 24 even if there is some error in the positioning of the lead 32 and the bump 24.

The lead 32 of the semiconductor chip 10 can be bonded by the steps described above.

This embodiment of the invention makes it possible to bond the conductive wire 16 to the electrode 12, tear off the conductive wire 16 so that a part thereof remains on the electrode 12, then form the bump 24 by simply pressing that part to flatten the upper surface thereof. These steps take less time in comparison with the steps required for forming the bump by plating. In addition, the upper surface of the bump 24 is flattened by pressing, and also the width of the lead 32 is less than the width of the upper surface of the bump 24, ensuring a good connection even if the position of the bump 24 is displaced slightly.

Figure 6:
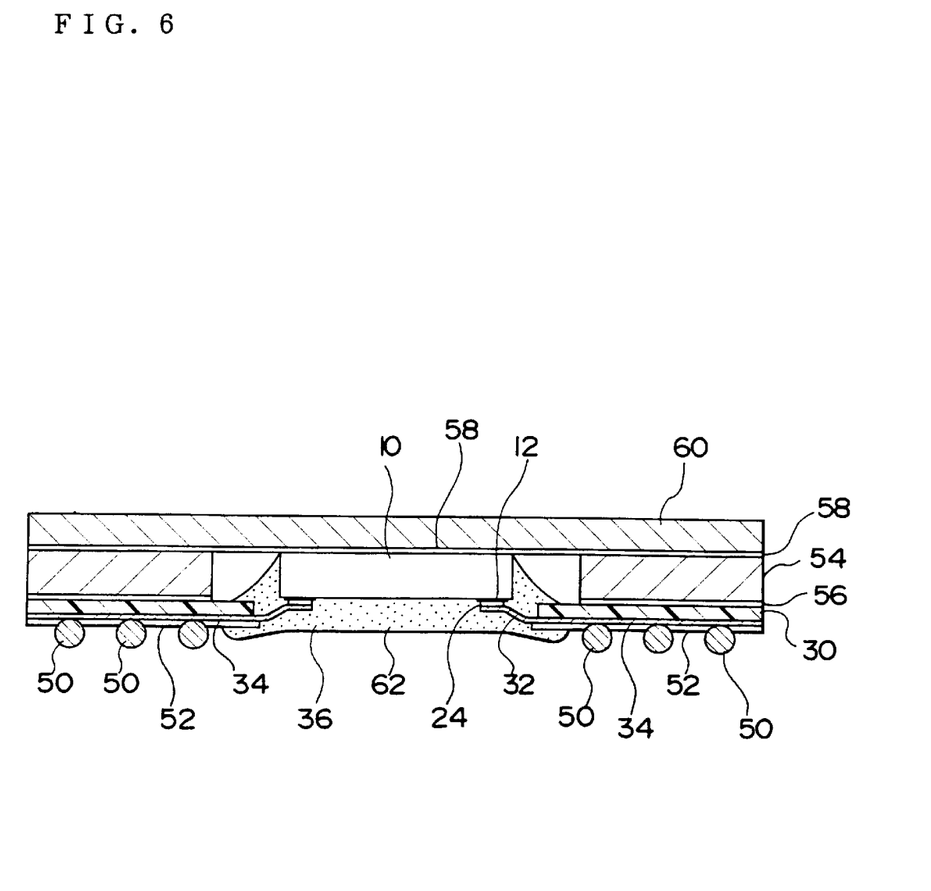
FIG. 6 shows a semiconductor device in accordance with the first embodiment of this invention.

A semiconductor device such as that shown in FIG. 6 is obtained by the steps known in the art. The semiconductor device shown in FIG. 6 is one wherein a BGA package is utilized. In other words, the semiconductor device shown in this figure comprises the substrate 30, the interconnecting pattern 34 formed on the substrate 30, a plurality of external electrodes 50 provided in the interconnecting pattern 34, and the semiconductor chip 10, and surface-mounting is enabled by the presence of the external electrodes 50.

The external electrodes 50 are solder balls, by way of example, that are connected electrically to electrodes 12 of the semiconductor chip 10 by the leads 32 that are connected electrically to the interconnecting pattern 34. Note that the external electrodes 50 could equally well be formed of a material other than solder, such as copper or the like. In addition, the surface of the substrate 30 on which the interconnecting pattern 34 is formed could be coated with a solder resist 52, avoiding the external electrodes 50. The solder resist 52 is intended to cover and protect the interconnecting pattern 34 in particular.

If a flexible substrate is used as the substrate 30, a plate-shaped stiffener 54 is provided on the side thereof opposite to the external electrodes 50. The stiffener 54 is formed of a material such as copper, stainless steel, or a copper alloy, has a strength sufficient to preserve the flat surface shape thereof, and is affixed on top of the substrate 30 by an insulating adhesive 56. Note that this insulating adhesive 56 is formed of a thermosetting or thermoplastic film. The stiffener 54 is affixed over the entirety of the substrate 30, avoiding the semiconductor chip 10. This prevents distortion or warping of the substrate 30, improves planarity by keeping the height of the external electrodes 50 constant, and improves the mounting yield onto circuit boards.

In addition, a radiator plate 60 is attached by a thermally conductive adhesive 58, such as silver paste, to the side of the semiconductor chip 10 opposite to the surface on which the electrodes 12 are formed. This makes it possible to increase the radiation capabilities of the semiconductor chip 10. The radiator plate 60 is formed to be larger than the semiconductor chip 10 and is attached also over the stiffeners 54. Note that the space between the stiffeners 54 and the radiator plate 60 is filled with the thermally conductive adhesive 58, to make a hermetic seal. Depending on the amount of heat generated by the semiconductor chip 10, the thermally conductive adhesive 58 could be replaced by an ordinary insulating adhesive or the previously described insulating film.

The space between the semiconductor chip 10 and the substrate 30 is sealed by potting with an epoxy resin 62. This epoxy resin 62 also enters the opening 36 and surrounds the outer periphery of the semiconductor chip 10.

Second Embodiment

Figure 7:
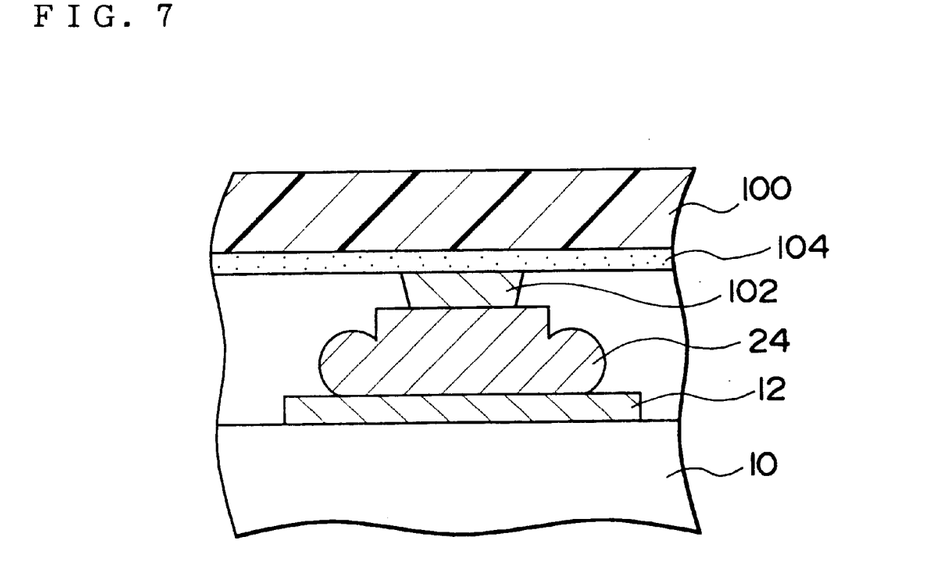
FIG. 7 shows a semiconductor device in accordance with a second embodiment of this invention.

A semiconductor device in accordance with a second embodiment of this invention is shown in FIG. 7. The semiconductor chip 10 on which are formed the electrodes 12 is also used in this embodiment, and the bumps 24 are formed on the electrodes 12. The structure and method of formation of these bumps 24 are as already described with reference to the first embodiment.

A lead 102 is formed on a substrate 100. The material of the substrate 100 can be selected from those materials that can be used for the substrate 30 of the first embodiment. A three-layer substrate wherein the lead 102 is affixed by an adhesive 104 could also be used as the substrate 100. Alternatively, the lead could be formed by sputtering an electrically conductive film of copper or the like onto a substrate, then etching it. In such a case, the lead is formed directly on the substrate to form a two-layer substrate with no adhesive therebetween. Further alternatively, an additive process could be used to form the lead by plating. Even further alternatively, a built-up multi-layer substrate configured of layers of insulating resin and interconnecting pattern on a substrate, or a multi-layer substrate configured of layers of a plurality of substrates could be used therefor.

The semiconductor chip 10 is bonded by either face-down bonding or flip-chip bonding onto the substrate 100. In other words, the bump 24 is placed in contact with the lead 102, then heat and pressure is applied thereto by a tool that is not shown in the figure. The bump 24 and the lead 102 are metal-connected thereby.

This embodiment comprises the same bump 24 as that of the first embodiment, and the same effects can be achieved thereby.

Third Embodiment

Figure 8:
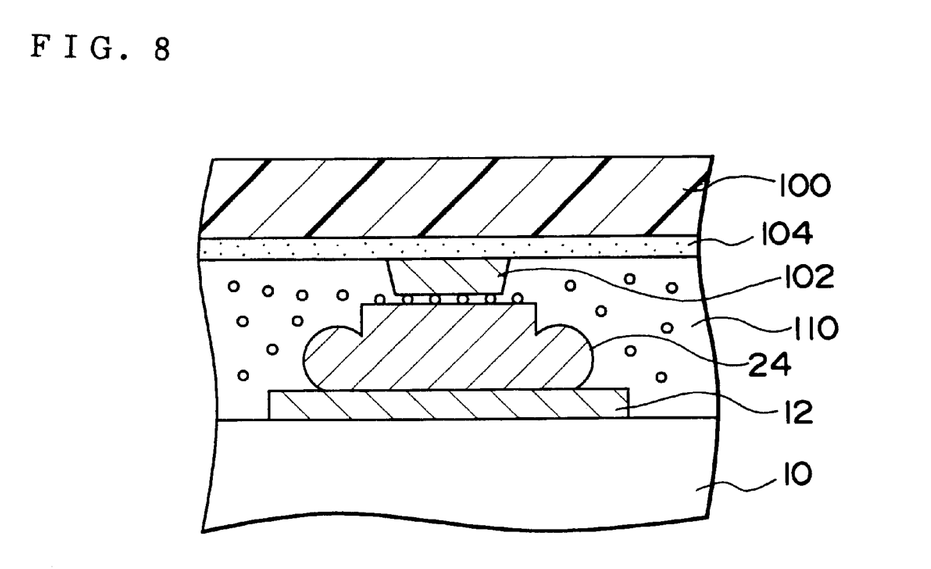
FIG. 8 shows a semiconductor device in accordance with a third embodiment of this invention.

A semiconductor device in accordance with a third embodiment of this invention is shown in FIG. 8. The semiconductor chip 10 on which are formed the electrodes 12 is also used in this embodiment, and the bumps 24 are formed on the electrodes 12. The structure and method of formation of these bumps 24 are as already described with reference to the first embodiment. The substrate 100 and the lead 102 are as already described with reference to the second embodiment.

The semiconductor chip 10 is bonded by either face-down bonding or flip-chip bonding onto the substrate 100, with an anisotropic conductive material 110 therebetween. The anisotropic conductive material 110 comprises conductive particles (electrically conductive filler) dispersed in an adhesive (binder), so a dispersive agent could also be added thereto. The anisotropic conductive material 110 could be formed beforehand as a sheet that is affixed to at least one of the substrate 100 and the semiconductor chip 10, or it could equally well be provided as a liquid. Note that a thermosetting adhesive could be used as the adhesive of the anisotropic conductive material 110. The anisotropic conductive material 110 is provided over at least a bonding portion of the lead 102 corresponding to the bump 24. Alternatively, providing the anisotropic conductive material 110 so as to cover the entire substrate 100 will make it possible to facilitate that step.

The anisotropic conductive material 110 is compressed between the bump 24 and the lead 102, and thus provides an electrical conduction therebetween by means of the conductive particles. The adhesive is then hardened to ensure the electrical conduction. If the adhesive is a thermosetting resin, it is hardened by the application of heat.

This embodiment comprises the same bump 24 as that of the first embodiment, and the same effects can be achieved thereby.

Figure 9:
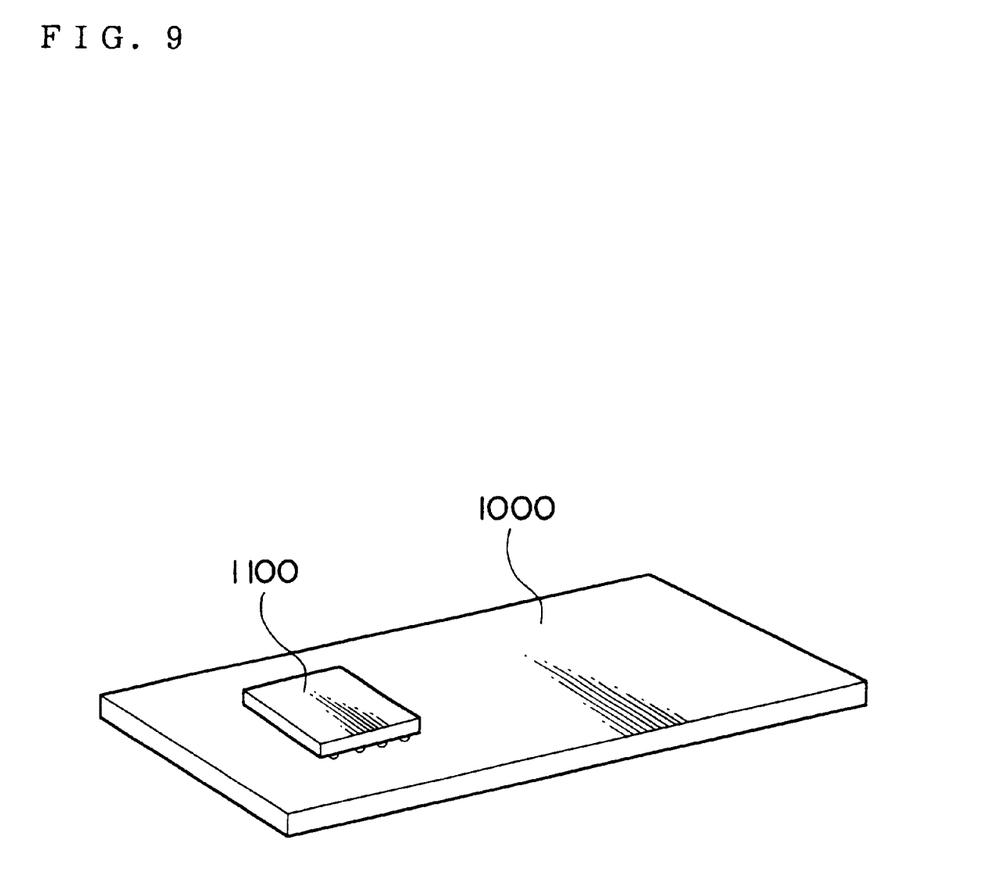
FIG. 9 shows a circuit board in accordance with another embodiment of this invention.

A circuit board 1000 on which is mounted a semiconductor device 1100 to which the present invention is applied is shown in FIG. 9. It is usual to employ an organic substrate such as a glass epoxy substrate as this circuit board. An interconnecting pattern is formed of a material such as copper on the circuit board to create desired circuits, and the design is such that this interconnecting pattern is connected electrically to external electrodes of the semiconductor device by a mechanical connection.

Figure 10:
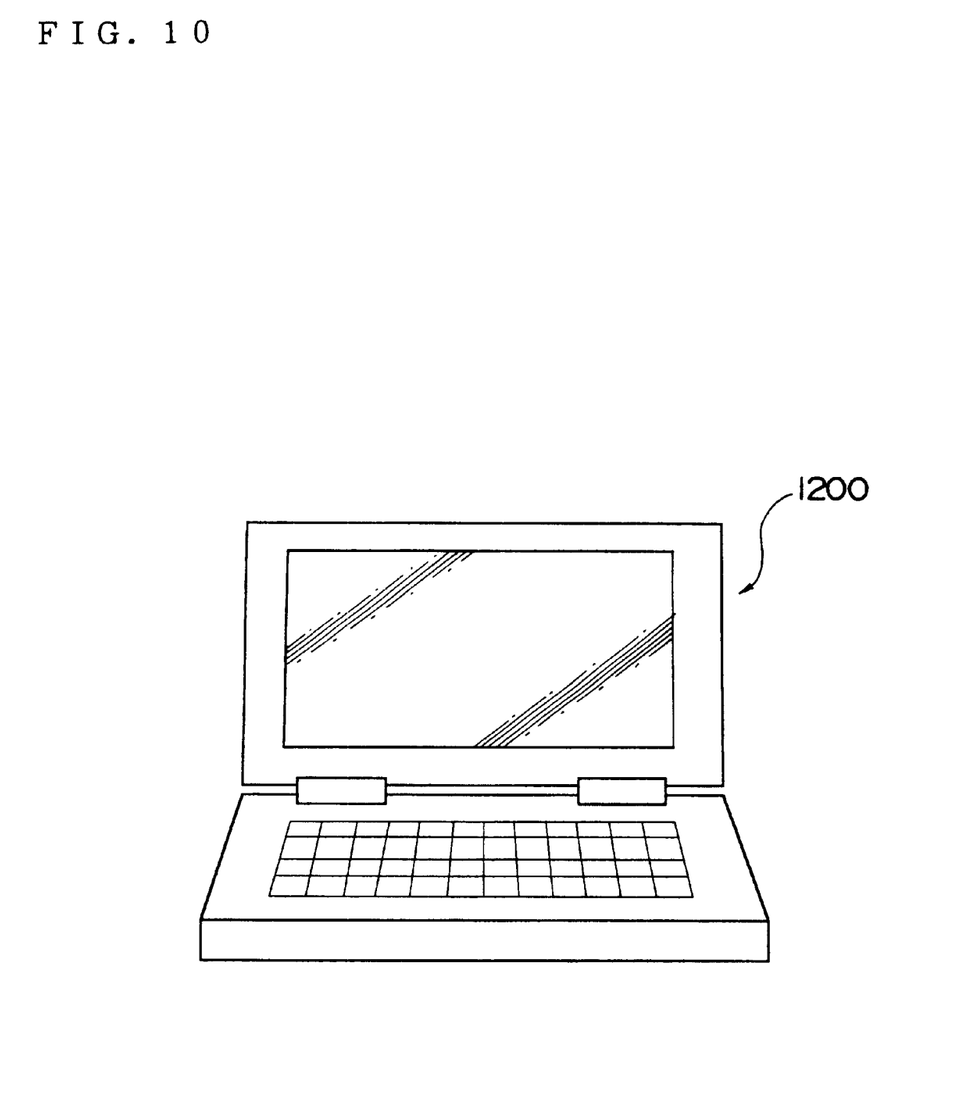
FIG. 10 shows electronic equipment that is provided with a semiconductor device which is fabricated using the method of this invention.

A notebook computer 1200 that is an example of electronic equipment provided with this circuit board 1000 is shown in FIG. 10.

Note that in the above described structural components of the present invention, "semiconductor chip" may be replaced by "electronic chip", and bumps can be formed on electrodes of such electronic chip (whether an active element or a passive element) in a similar manner to that of a semiconductor chip. Examples of electronic components configured of such electronic chips include resistors, capacitors, coils, oscillators, filters, temperature sensors, thermistors, varistors, variable potentiometers, and fuses.

Experimental Results

The description now turns to the results of experiments performed on the bonding between a lead and a bump. These experiments involved varying the shape of the bump 24 shown in FIG. 3, bonding the resultant bump to the lead 32, and investigating whether or not bonding defects occurred. More specifically, the width A of the base portion 28 of the bump 24 was set to 60 $\mu$m; the width B of the head portion 26 was set to 30, 40, and 50 $\mu$m; and in each case the distance D between the upper surface of the base portion 28 and the upper surface of the head portion 26 was set to each of 2, 6, and 10 $\mu$m. The results of these experiments were as shown below.

TABLE 1

A: 60 $\mu$m
B: 30, 40, 50 $\mu$m
C: 40 $\mu$m

| B/A (%) | D ($\mu$m) | F/C(%) | | | | |
|---|---|---|---|---|---|---|
| | | 10 | 15 | 20 | 25 | 30 |
| 50 | 10 | x | x | x | x | X |
| | 6 | o | o | x | x | X |
| | 2 | o | o | o | o | X |
| 67 | 10 | o | x | x | x | X |
| | 6 | o | o | x | x | X |
| | 2 | o | o | o | o | X |
| 83 | 10 | o | o | x | x | X |
| | 6 | o | o | x | x | X |
| | 2 | o | o | o | o | X |

In this table, F is the length by which the lead 32 bonded to the bump 24 extends beyond the base portion 28, as shown in FIG. 3. The ratio F/C is the ratio (%) by which the lead 32 extends beyond the base portion. When F/C is each of 10, 15, 20, 25, and 30 the total absence of bonding defects is indicated by o, whereas the presence of even one bonding defect is indicated by x. Note that errors in the bonding position of the lead 32 are determined by the accuracy of the bonding equipment, so the experiments were all performed by using bonding equipment of the same accuracy. This meant that the probability of protrusion of the lead 32 beyond the base portion was the same under all conditions.

When B=30 $\mu$m, B/A=50%. When D=10 in that case, bonding defects were observed when F/C was 10, 15, 20, 25, or 30. When D=6, bonding defects were observed when F/C was 20, 25, or 30, but no bonding defects were observed when F/C was 10 or 15. Similarly, when D=2, bonding defects were observed when F/C was 30, but no bonding defects were observed when F/C was 10, 15, 20, or 25.

When B=40 $\mu$m, B/A=67%. When D=10 in that case, bonding defects were observed when F/C was 15, 20, 25, or 30, but no bonding defects were observed when F/C was 10. When D=6, bonding defects were observed when F/C was 20, 25, or 30, but no bonding defects were observed when F/C was 10 or 15. Similarly, when D=2, bonding defects were observed when F/C was 30, but no bonding defects were observed when F/C was 10, 15, 20, or 25.

When B=50 $\mu$m, B/A=83%. When D=10 in that case, bonding defects were observed when F/C was 20, 25, or 30, but no bonding defects were observed when F/C was 10 or 15. When D=6, bonding defects were observed when F/C was 20, 25, or 30, but no bonding defects were observed when F/C was 10 or 15. Similarly, when D=2, bonding defects were observed when F/C was 30, but no bonding defects were observed when F/C was 10, 15, 20, or 25.

It can be seen from the above results that, the quality of the bond between the lead and the bump was always the same when $D \leq 6$ $\mu$m, regardless of the value of B/A, in other words, regardless of the magnitude of B if A is constant.

It is therefore possible to perform bonding of the lead to the bump with good accuracy by setting $D \leq 6$ $\mu$m.

What is claimed is:

1. A method of fabricating a semiconductor device comprising:
   (a) bonding a conductive wire to any one of a plurality of electrodes of a semiconductor chip;
   (b) tearing off the bonded conductive wire in such a manner that a part of the conductive wire remains on the one of the electrodes;
   (c) pressing the part of the conductive wire that remains on the one of the electrodes, to form a bump comprising a base portion in contact with the one of the electrodes and a head portion of a width that is less than the width of the base portion, the head portion projecting from the base portion, the bump having a groove along a boundary between the head portion and the base portion, the groove having a depth in a direction of a thickness of the base portion; and
   (d) bonding the bump and a lead.

2. The method of fabricating a semiconductor device as defined in claim 1,
   wherein a width A of the base portion of the bump, a width B of the head portion of the bump, and a width C of the lead are in a relationship such that: $C>(A-B)/2$.

3. The method of fabricating a semiconductor device as defined in claim 2,
   wherein the (a) and (b) steps are repeated before the (c) step, to provide parts of conductive wires on the plurality of electrodes; and
   wherein the parts of the conductive wires remaining on the plurality of electrodes are simultaneously pressed in the (c) step, to form a plurality of bumps simultaneously.

4. The method of fabricating a semiconductor device as defined in claim 3,
   wherein the lead protrudes into an opening formed in a substrate; and
   wherein the bump is disposed within the opening such that the lead is bonded to the bump within the opening in the (d) step.

5. The method of fabricating a semiconductor device as defined in claim 3,
   wherein the lead is formed on a substrate; and
   wherein the bump is arranged to face the lead on the substrate for the face-down bonding of the semiconductor chip in the (d) step.

6. The method of fabricating a semiconductor device as defined in claim 2,
   wherein the lead protrudes into an opening formed in a substrate; and
   wherein the bump is disposed within the opening such that the lead is bonded to the bump within the opening in the (d) step.

7. The method of fabricating a semiconductor device as defined in claim 2,
   wherein the lead is formed on a substrate; and
   wherein the bump is arranged to face the lead on the substrate for the face-down bonding of the semiconductor chip in the (d) step.

8. The method of fabricating a semiconductor device as defined in claim 1,
   wherein the (a) and (b) steps are repeated before the (c) step, to provide parts of conductive wires on the plurality of electrodes; and
   wherein the parts of the conductive wires remaining on the plurality of electrodes are simultaneously pressed in the (c) step, to form a plurality of bumps simultaneously.

9. The method of fabricating a semiconductor device as defined in claim 8,
   wherein each lead protrudes into an opening formed in a substrate; and
   wherein the bump is disposed within the opening such that the lead is bonded to the bump within the opening in the (d) step.

10. The method of fabricating a semiconductor device as defined in claim 8,
    wherein each lead is formed on a substrate; and
    wherein the bump is arranged to face the lead on the substrate for the face-down bonding of the semiconductor chip in the (d) step.

11. The method of fabricating a semiconductor device as defined in claim 1,
    wherein the lead protrudes into an opening formed in a substrate; and
    wherein the bump is disposed within the opening such that the lead is bonded to the bump within the opening in the (d) step.

12. The method of fabricating a semiconductor device as defined in claim 1,
    wherein the lead is formed on a substrate; and
    wherein the bump is arranged to face the lead on the substrate for the face-down bonding of the semiconductor chip in the (d) step.

13. The method of fabricating a semiconductor device as defined in claim 12,
wherein the bump is bonded to the lead in the (d) step by an anisotropic conductive material formed of conductive particles dispersed within an adhesive.

14. A semiconductor device comprising:

a substrate having a lead formed thereon; and a semiconductor chip having a bump formed thereon and electrically connected to the lead, the bump having a base portion and a head portion of a width smaller than the width of the base portion, the head portion projecting from the base portion, the bump having a groove along a boundary between the head portion and the base portion, the groove having a depth toward the semiconductor chip in a direction of a thickness of the base portion.

15. The semiconductor device as defined in claim 14, wherein a width A of the base portion of the bump, a width B of the head portion of the bump, and a width C of the lead are in a relationship such that: $C>(A-B)/2$.

16. The semiconductor device as defined in claim 14, wherein the substrate has an opening;

wherein the lead protrudes into the opening in the substrate; and wherein the bump is bonded to the lead within the opening.

17. The semiconductor device as defined in claim 14, wherein the lead is formed on a substrate; and wherein the bump is arranged to face the lead on the substrate for the face-down bonding of the semiconductor chip.

18. The semiconductor device as defined in claim 14, wherein the bump is bonded to the lead by an anisotropic conductive material formed of conductive particles dispersed within an adhesive.

19. A circuit board on which is mounted the semiconductor device as defined in claim 14.

20. Electronic equipment having the semiconductor device as defined in claim 14.

21. A method for fabricating a semiconductor device comprising:

(a) bonding a conductive wire to any one of a plurality of electrodes of a semiconductor chip;

(b) tearing off the bonded conductive wire in such a manner that a part of the conductive wire remains on the one of the electrodes;

(c) pressing the part of the conductive wire that remains on the one of the electrodes, to form a bump comprising a base portion in contact with the one of the electrodes and a head portion of a width that is less than the width of the base portion, the head portion projecting from the base portion, the base portion having a higher portion than a boundary between the head portion and the base portion; and (d) bonding the bump and a lead.

22. A semiconductor device comprising:

a substrate having a lead formed thereon; and a semiconductor chip having a bump formed thereon and electrically connected to the lead, the bump having a base portion and a head portion of a width smaller than the width of the base portion, the head portion projecting from the base portion, the base portion having a higher portion than a boundary between the head portion and the base portion.

* * * * *